(12) United States Patent
Lundberg

(10) Patent No.: US 7,133,269 B2
(45) Date of Patent: Nov. 7, 2006

(54) OVERVOLTAGE PROTECTION APPARATUS

(75) Inventor: James R. Lundberg, Austin, TX (US)

(73) Assignee: Via Technologies, Inc., Taipai (TW)

( * ) Notice: Subject to any disclaimer, the term of this patent is extended or adjusted under 35 U.S.C. 154(b) by 220 days.

(21) Appl. No.: 10/833,401

(22) Filed: Apr. 28, 2004

(65) Prior Publication Data

US 2005/0195543 A1 Sep. 8, 2005

Related U.S. Application Data

(60) Provisional application No. 60/550,593, filed on Mar. 4, 2004.

(51) Int. Cl.
*H02H 3/20* (2006.01)

(52) U.S. Cl. ............... 361/91.1; 361/111; 361/56

(58) Field of Classification Search ............... 361/91.1
See application file for complete search history.

(56) References Cited

U.S. PATENT DOCUMENTS

| | | | |
|---|---|---|---|
| 4,535,294 A | 8/1985 | Ericksen et al. | |
| 5,369,319 A | 11/1994 | Good et al. | |
| 5,973,534 A | 10/1999 | Singh | |
| 6,249,162 B1 | 6/2001 | Inoue | |
| 6,281,702 B1 | 8/2001 | Hui | |
| 6,281,731 B1 | 8/2001 | Fifield et al. | |
| 6,359,485 B1 | 3/2002 | Drapkin et al. | |
| 6,400,546 B1 * | 6/2002 | Drapkin et al. | 361/111 |
| 6,665,354 B1 | 12/2003 | Drapkin et al. | |
| 6,798,629 B1 * | 9/2004 | Proebsting | 361/56 |

OTHER PUBLICATIONS

Adel S. Sedra□□Microelectronics Circuits□□1987□□CBS College Publishing□□Second Edition□□p. 345.*

* cited by examiner

*Primary Examiner*—Robert L. Deberadinis
*Assistant Examiner*—Luis E. Román
(74) *Attorney, Agent, or Firm*—Gary R. Stanford; Richard K. Huffman; James W. Huffman

(57) ABSTRACT

An overvoltage protection circuit for a receiver including first and second pass devices and a protection control circuit. The receiver detects the state of a high voltage level input signal using a switching threshold based on a low voltage level source voltage. The receiver has a maximum voltage limit between the low and high voltage levels. The first pass device passes the input signal up to a first voltage level below the source voltage. The second pass device is effectively coupled in parallel with the first pass device. The protection control circuit controls the second pass device to allow the input signal to rise above the first voltage level up to a threshold voltage that is above the source voltage sufficient to meet the logic switching threshold yet below the maximum voltage limit.

19 Claims, 3 Drawing Sheets

OVERVOLTAGE PROTECTION APPARATUS

CROSS-REFERENCE TO RELATED APPLICATIONS

This application claims the benefit of U.S. Provisional Application Ser. No. 60/550,593, entitled OVERVOLTAGE PROTECTION APPARATUS, which was filed on Mar. 4, 2004, and which is herein incorporated by reference for all intents and purposes.

This application is related to the following co-pending U.S. patent application, which is filed on the same day as this application, which has a common assignee and at least one common inventor, and which is herein incorporated by reference in its entirety for all intents and purposes:

| SERIAL NUMBER | FILING DATE | TITLE |
|---|---|---|
| (CNTR.2218) | HEREWITH | INPUT RECEIVER WITH HYSTERESIS |

BACKGROUND OF THE INVENTION

1. Field of the Invention

The present invention relates to overvoltage protection circuits, and more particularly to a method and apparatus for establishing an input voltage sufficient to excite threshold detection circuitry while satisfying device input voltage limit requirements.

2. Description of the Related Art

Over more recent years, integrated circuits (ICs) and their commensurate operating voltages have been scaled to the degree that overvoltage protection is often needed or otherwise desired at the input of a receiver or threshold detection device receiving an input signal that exceeds a maximum input voltage level of the receiver. The Assisted Gunning Transceiver Logic (AGTL) bus, for example, operates at voltage levels in the range of 1.25–1.5 Volts (V) yet may receive higher voltage signals, such as a 3.3V signal from a power supply having a 1V switching threshold or a 2.5V signal having a 1.25V switching threshold. An AGTL input receiver operates using a standard reference bus voltage VTT of 1.5 V with a switching threshold of ⅔ VTT or 1V. More recent AGTL bus specifications contemplate even lower voltage levels, such as a 1.25V bus having a 0.83V reference threshold. AGTL is referenced solely for purposes of illustration; the present invention applies to any threshold detection device or receiver in which it is desired to limit input voltage.

A voltage limit circuit may be included to clamp the maximum voltage applied to a lower voltage input device. A conventional clamp circuit includes an NMOS device having its gate coupled to a source voltage (e.g., VTT), its source receiving the input signal operating within the higher voltage range, and its drain provided to the input of the lower voltage input device. Accordingly, when the input signal increases to a threshold below VTT, the NMOS device turns off, clamping the signal provided to the differential input receiver to a threshold below VTT. VTT is generally the source voltage of the threshold detection device, and may be provided from an external source, such as a bus voltage or the like.

Conventional input over-voltage protection devices, such as the NMOS device just described, may become problematic when these devices clamp input signal voltages too low to reliably excite corresponding threshold detection circuits. For instance, in a system where the source voltage VTT is 1.5V, a conventional NMOS input voltage clamp would clamp the signal provided to the differential input to approximately 1.1V, which is VTT minus the quantity of an NMOS threshold plus body effect. This level is only 0.1V above the 1V threshold voltage for an AGTL configuration. Clamping the input signal to this lower level may not provide for reliable detection of a logic high state of the input signal under operating conditions that include bus noise, thermal gradients, and power supply variation.

SUMMARY OF THE INVENTION

An overvoltage protection circuit for a receiver according to an embodiment of the present invention includes first and second pass devices and a protection control circuit. The receiver has an input for detecting the state of a high voltage level input signal using a logic switching threshold based on a low voltage level source voltage. The input has a maximum voltage limit between the low and high voltage levels. The first pass device has a control terminal receiving the source voltage and a current path for passing the input signal to the input of the receiver up to a first voltage level below the source voltage. The second pass device has a control terminal and a current path coupled in parallel with the current path of the first pass device. The protection control circuit controls the second pass device to allow the input signal to rise above the first voltage level up to a threshold voltage that is above the source voltage sufficient to meet the logic switching threshold yet below the maximum voltage limit. The second pass device includes a first P-channel device having a gate coupled to the protection control circuit, a source for receiving the input signal, and a drain for coupling to the input of the receiver. The receiver has an output for providing an output signal indicative of the input signal. The protection control circuit has an N-channel circuit and a P-channel circuit. The N-channel circuit is coupled to the gate of the first P-channel device and receives the output signal, that holds the first P-channel device on while the input signal increases until the input circuit changes the state of the output signal. The P-channel circuit is coupled to the source and gate of the first P-channel device and receives the input signal and the source voltage, that turns off the first P-channel device when the input signal reaches the threshold voltage.

In a more specific embodiment, the N-channel circuit includes first and second N-channel devices. The first N-channel device has a source coupled to ground, a gate receiving the output signal, and a drain. The second N-channel device has a source coupled to the drain of the first N-channel device, a gate receiving the source voltage, and a drain coupled to the gate of the first P-channel device. The P-channel circuit includes second, third and fourth P-channel devices. Each of the P-channel devices has a bulk coupled to a well node. The second P-channel device has a source receiving the source voltage, a gate receiving the input signal, and a drain coupled to the well node. The third P-channel device has a gate receiving the source voltage, a source receiving the input signal, and a drain coupled to the well node. The fourth P-channel device has a drain coupled to the gate of the first P-channel device, a gate receiving the source voltage, and a source and bulk coupled to the well node. The second P-channel device is operative to clamp the well node to the source voltage while the input signal is below the source voltage. The third P-channel device is operative to pull the well node to the level of the input signal when the input signal rises a P-channel threshold above the source voltage. The fourth P-channel device is operative to drive the gate of the first P-channel device to the well node voltage when the well node rises a P-threshold above the source voltage, hence to the input voltage.

The overvoltage protection circuit may further include a fifth P-channel device having a gate and source receiving the source voltage and a drain coupled to the drain of the first P-channel device. In this case, the fifth P-channel device is operative to limit the drains of the first P-channel and N-channel devices to a peak voltage which is a channel threshold above the source voltage VTT, and which is less than the maximum voltage limit.

A switching circuit according to an embodiment of the present invention for indicating the state of an input signal which ranges up to a high voltage includes a sense circuit and first and second clamp circuits. The sense circuit has an input for sensing the state of the input signal relative to a reference voltage based on a source voltage which is less than the high voltage. The sense circuit further has an output for providing a first output signal indicative of the state of the input signal, where the input is limited to a maximum voltage that is greater than the source voltage and less than the high voltage. The first clamp circuit passes the input signal to the input of the sense circuit up to a first voltage that is less than the source voltage. The second clamp circuit passes the input signal to the input of the sense circuit up to a threshold voltage that is between the source and maximum voltages.

The threshold voltage is sufficient to excite the sense circuit under expected operating conditions, such as including noise, thermal gradients, and power supply variation. The first clamp circuit may be an N-channel device and the second clamp circuit may include a first P-channel device and a voltage control circuit coupled to the gate of the first P-channel device. In a more specific embodiment, the voltage control circuit includes an N-channel circuit and a P-channel circuit in a similar manner as previously described.

A method of ensuring logic threshold detection while providing overvoltage protection for an input device that detects the state of an input signal having a high logic level that exceeds the maximum input voltage level of the input device according to an embodiment of the present invention includes coupling the source-to-drain pat of a first N-channel device between an input signal and the input of the input device and providing a source voltage to the gate of the first N-channel device, coupling the source-to-drain path of a first P-channel device between an input signal and the input of the input device, pulling the gate of the first P-channel device low to turn on the first P-channel device to pass the input signal to the input device input until the input device changes state, and pulling the gate of the first P-channel device high to the level of the input signal to turn off the first P-channel device when the input signal reaches a threshold level above the source voltage and sufficient to switch the input device.

The method may further include coupling the source-to-drain path of at least one second N-channel device between the gate of the first P-channel device and a low voltage level and controlling the second N-channel device with the output of the input device. The method may further include coupling the source-to-drain path of a second P-channel device between a well node and the source voltage and providing the input signal to the gate of the second P-channel device, coupling the source-to-drain path of a third P-channel device between the input signal and the well node and providing the source voltage to the gate of the third P-channel device, and coupling the drain-to-source path of a fourth P-channel device between the gate of the first P-channel device and the well node and providing the source voltage to the gate of the fourth P-channel device. The method may further include clamping the input of the input device to a peak level that is less than the maximum input voltage level. The method may further include providing the source voltage to the gate and source of a fifth P-channel device and coupling the drain of the fifth P-channel device to the drain of the first P-channel device.

BRIEF DESCRIPTION OF THE DRAWINGS

The benefits, features, and advantages of the present invention will become better understood with regard to the following description, and accompanying drawings where.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

The inventors of the present application have recognized the need for providing overvoltage protection while also ensuring that the input voltage rises above the switching threshold level of the input device or receiver. They have therefore developed an overvoltage protection apparatus with input signal detection that allows input levels up to and slightly higher than the source voltages, thus enabling input voltages sufficient to excite level detection circuitry while at the same time satisfying device input voltage limit requirements, as will be further described below with respect to FIGS. 1–3.

Figure 1:
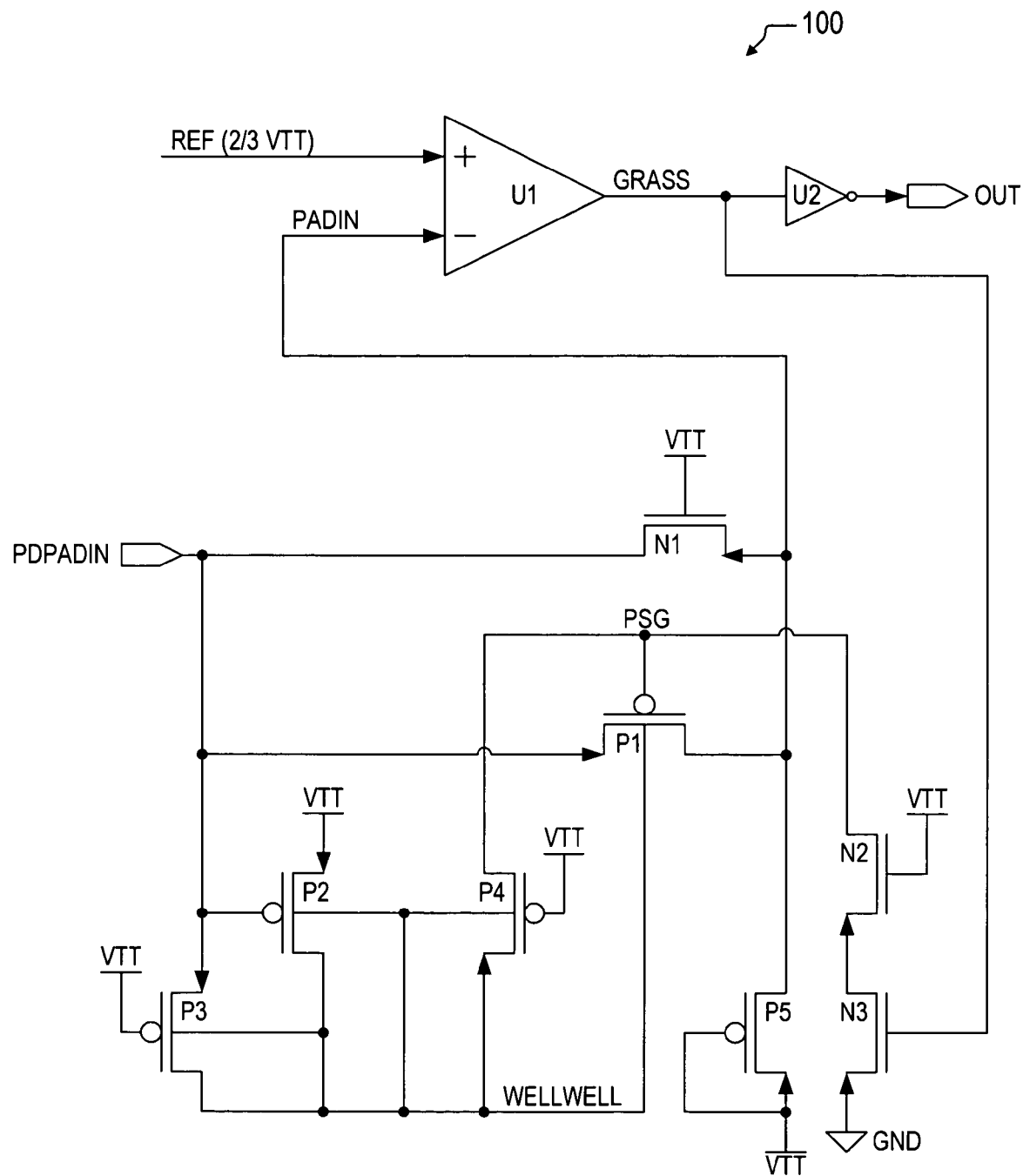
FIG. 1 is a schematic diagram of a switching circuit including an overvoltage protection circuit with input signal threshold detection implemented according to an exemplary embodiment of the present invention.

FIG. 1 is a schematic diagram of a switching circuit 100 including an overvoltage protection circuit with input signal level detection implemented according to an exemplary embodiment of the present invention. The switching circuit 100 receives an input signal PDPADIN whose state is to be detected by a sense circuit U1. The sense circuit U1 in this example is an input receiver such as used for AGTL configurations. It is understood, however, that the present invention is not limited to AGTL configurations and is applicable to any sense circuit having level detection logic and in which it is desired or otherwise required to have overvoltage protection. The sense circuit U1 detects a high level on PDPADIN when a voltage-limited version of the input signal, referred to as PADIN, exceeds a reference voltage REF, which is approximately ⅔ of the source voltage VTT. As shown, PADIN is provided to the inverting input and REF is provided to the non-inverting input of U1. U1 asserts an output signal GRASS, which is provided to the input of an inverter U2, which provides a corresponding output signal OUT. Thus, the GRASS signal provides an inverted indication of PDPADIN and the OUT signal provides a non-inverted indication of PDPADIN.

The PDPADIN signal is provided to the drain of an N-channel device N1, such as an NMOS transistor or the like, having its gate coupled to VTT and its source providing the voltage-limited input signal PADIN to the inverting input of U1. In a conventional overvoltage protection circuit, only the device N1 is provided. Accordingly, when PADIN increases to a threshold (plus body effect) below VTT, N1 turns off, clamping PADIN to that lower voltage level. Clamping the PADIN signal to the lower threshold level does not provide for reliable detection of a logic high state of the PDPADIN signal under operating conditions that include bus noise, thermal gradients, and power supply variation.

The switching circuit 100 includes a P-channel pass device P1, having a drain and source coupled to the drain and source, respectively, of N1. Thus, the controlled current path of P1 is coupled in parallel with the controlled current path of N1 to modify voltage clamp operation. The gate of P1 receives a signal PSG, which is provided to the drain of an N-channel device N2 and to the drain of a P-channel device P4. The PDPADIN signal is also provided to the source of a P-channel device P3 and the gate of a P-channel device P2. The gate of P3, the source of P2, the gate of P4, the gate of N1, and the gate of N2 are coupled to the source voltage VTT. The drains of P2 and P3 and the source of P4, along with the well-ties of P1–P4 are coupled together to form a well node referred to as WELLWELL. The drain of a P-channel device P5 is coupled to the drains of N1 and P1, and the source and gate of P5 are coupled together to VTT. The source of N2 is coupled to the drain of an N-channel device N3, having its source coupled to a low voltage reference (e.g., ground or "GND") and its gate coupled to the GRASS signal.

As will be further described below, N1 operates as a first pass device for passing lower voltage levels of PDPADIN to U1 to ensure a low logic level is detected. P1 operates as a second pass device for passing the input signal to U1 up to a threshold level suitable to ensure switching without exceeding maximum voltage limits of U1, which ensures a high logic level is detected. The remaining devices, namely N2–N3 and P2–P5, form a voltage control or protection control circuit to control P1 to allow PADIN to rise above the voltage level otherwise limited by N1 to meet the logic switching threshold of U1 and below the maximum voltage limit of U1. The devices N2 and N3 form an N-channel circuit that holds P1 on until U1 switches, e.g., when GRASS goes low. The devices P2–P4 form a P-channel circuit that turns P1 off when PDPADIN increases to a P-device threshold (or greater) above source voltage VTT. The P-channel circuit further includes P5 to clamp PADIN to a voltage limit which is a P-channel threshold above source voltage VTT and this voltage limit ensures overvoltage protection of U1.

Figure 2:
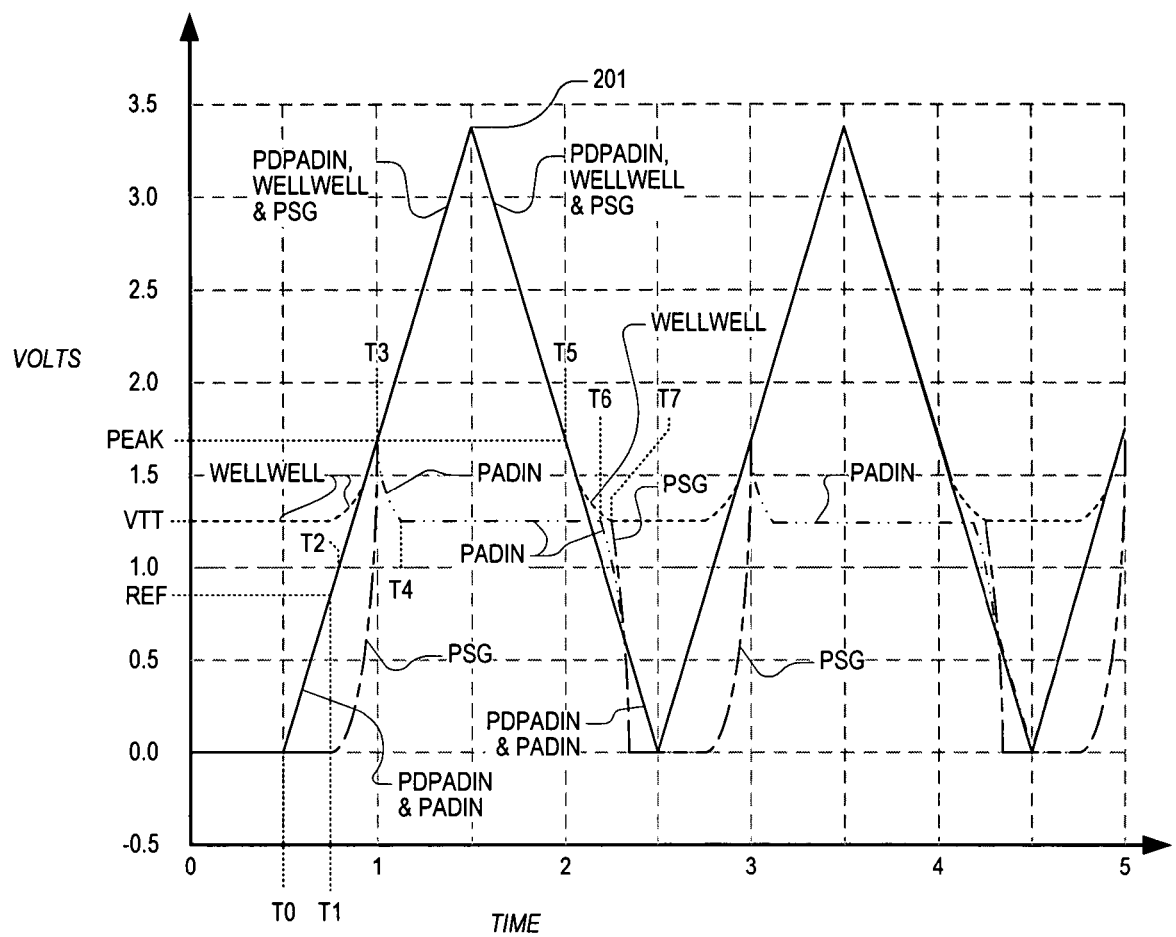
FIG. 2 is a timing diagram illustrating operation of the switching circuit of FIG. 1.

FIG. 2 is a timing diagram illustrating operation of the switching circuit 100. The voltages of the signals PDPADIN, PADIN, PSG and WELLWELL are plotted versus time, where time is measured in arbitrary units (e.g., seconds, milliseconds, microseconds, etc.). In this example, the voltage level of VTT is 1.25V and the switching threshold of U1, or REF, is approximately 0.83V. The input signal, PDPADIN, is shown as a triangular waveform varying between 0V and a relatively high voltage level of about 3.3V. As shown, PDPADIN starts at 0V at a time 0, linearly increases to reach 3.3V at a time 1.5, then linearly decreases back to 0V at time 2.5, and repeats in this manner with a period of 2 time units. It is understood that PDPADIN need not be a periodic signal but is any logic or digital signal. It is desired to clamp PADIN at some threshold just above the source voltage VTT to allow PADIN to reach a high enough voltage level to ensure switching of U1 without exceeding maximum voltage limits of U1. In the particular embodiment shown, PADIN is allowed to increase to a voltage limit PEAK, which is approximately a P-channel threshold above source voltage VTT.

In operation, PDPADIN is initially low (or 0V) at a time T0. When PDPADIN is low, N1 is on so that PDPADIN pulls PADIN low and U1 initially asserts GRASS high. N2 is biased to VTT, so that it is on constantly. Since GRASS turns N3 on, PSG is initially pulled low to GND (or 0V) via N2 and N3. Since the gate and source and the drain of P1 are all low, it is initially off while N1 is on at lower voltages. PDPADIN initially pulls the gate of P2 low so that it is turned on, which initially drives node WELLWELL to VTT. PDPADIN rises and reaches the REF threshold at a time T1. REF is the theoretical switching threshold for U1, so that assuming PADIN is at REF via N1, U1 ideally switches at about this point. REF, however, is a relatively high switching threshold relative to VTT. And further, various operating variations or factors, such as bus noise, thermal gradients, power supply variation, etc., may cause the actual switching point to be even higher, so that there is no assurance that U1 switches at time T1.

N-channel and P-channel devices have associated voltage thresholds VTH from gate to source associated with turn on and turn off switching points. Although the switching thresholds may be different between N- and P-channel devices, it is assumed for purposes of simplicity of explanation that the N- and P-channel devices both have a switching threshold of about 0.25V. Since PSG is still pulled low, P1 turns on about when PDPADIN reaches 0.25V and is on at time T1. When PDPADIN reaches 1.0V at a time T2, N1 begins to turn off, and would otherwise effectively clamp PADIN to about 0.9V. Although this is above the REF switching threshold of 0.83V for the case illustrated, this still does not provide sufficient noise immunity and gain above REF to ensure switching of U1. In general, REF is already a relatively high threshold, and various circuit factors potentially allow N1 to clamp PADIN below the actual switching threshold. When N1 is turned off, however, P1 is fully on and allows PADIN to follow PDPADIN above the clamping level of N1 to ensure switching.

At about time T2, P2 also begins to turn off since its source is tied to VTT. At a time T3, if P1 is still on so that PDPADIN pulls PADIN to PEAK, P5 turns on clamping PADIN to the maximum level of PEAK. P5 clamps PADIN to PEAK to prevent PADIN from rising above the maximum voltage allowable for U1. U1 switches sometime between T2 and T3 and pulls GRASS low, turning off N3 so that PSG is no longer pulled low. In the interim between times T2 and T3, PDPADIN reaches and exceeds VTT, turning P3 on driving WELLWELL from VTT to the level of PDPADIN. When WELLWELL increases to a threshold above VTT, such as about 1.5V, P4 turns on to drive PSG with WELLWELL so that PSG begins to rise towards the level of PDPADIN. Before PSG reaches PDPADIN, it reaches a threshold below PDPADIN and turns P1 off. P1 is turned off to clamp PADIN at a threshold level sufficient to ensure switching of U1. Since N1 and P1 are both off, PDPADIN is allowed to increase beyond PEAK while PADIN is clamped at or below PEAK to prevent damaging the input detection circuit U1.

Although PEAK is shown to be about 1.7V, P5 turns on about a threshold above its gate threshold at VTT or at about 1.5V, so that PADIN will likely not significantly exceed the 1.5V level. Also, P4 may turn on pulling PSG to PDPADIN and WELLWELL when they reach about 1.5V, so that both N1 and P1 are off at that time. P5 helps to ensure that PADIN does not rise above PEAK. After P1 turns off, PADIN decreases from the PEAK level above VTT back to approximately VTT at time T4 through leakage of P5. One skilled in the art will appreciate that leakage through P5 can be reduced or otherwise eliminated, if desired, through proper sizing of P5. In this manner, PADIN is clamped at some level between PEAK and VTT depending upon the particular implementation.

After PDPADIN reaches its peak level as shown at 201, it decreases again and falls below PEAK at a time T5 and drops towards VTT. When PDPADIN drops a threshold voltage above VTT, P3 turns off. When PDPADIN drops a threshold voltage below VTT, P2 turns on so that WELLWELL eventually clamps to VTT once again. PSG is discharged to a threshold above VTT and P4 turns off. Meanwhile, N1 turns on and PADIN is pulled down beginning at a time T6 towards the level of PDPADIN. When PADIN falls below the switching threshold of U1 (e.g., REF), U1 switches and pulls GRASS high turning on N3. Since N2 is already on, N2 and N3 pull PSG low again beginning at a time T7. PADIN follows PDPADIN low and back up again via clamp devices N1 and P1 and operation repeats in the same manner. Since PSG rises to the peak level of PDPADIN, N2 is biased on to protect device N3 from the high voltage levels. PDPADIN rises to about 3.3V, VTT is 1.25V and PADIN rises to about 1.5V, so that P1 and P5 prevent excessive voltage levels across N1 (e.g., gate to channel, gate to bulk, gate to source, or gate to drain).

Figure 3:
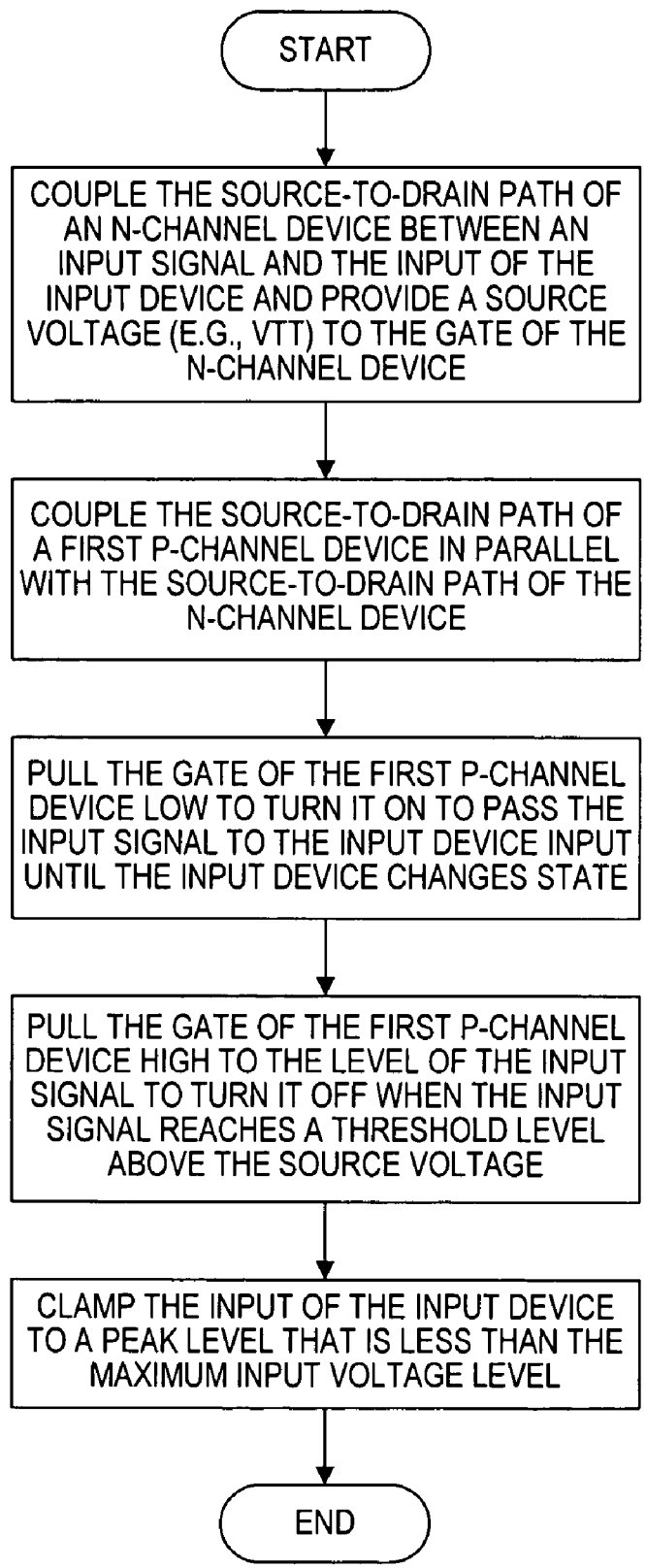
FIG. 3 is a flowchart diagram illustrating an exemplary method of ensuring logic threshold detection while providing overvoltage protection for an input device according to an embodiment of the present invention.

FIG. 3 is a flowchart diagram illustrating an exemplary method of ensuring logic threshold detection while providing overvoltage protection for an input device according to an embodiment of the present invention. The input device is intended to detect the state of an input signal having a high logic level that exceeds the maximum input voltage level of the input device. At a first block 301, the source-to-drain path of a first N-channel device is coupled between an input signal and the input of the input device and a source voltage (e.g., VTT) is provided to the gate of the first N-channel device. This alone effectively forms the conventional overvoltage protection circuit such as illustrated by N1. At next block 303, the source-to-drain path of a first P-channel device is coupled between an input signal and the input of the input device. In this manner, the P-channel device is placed in parallel with the N-channel device.

Since the input signal is also applied at one end of the source-to-drain path of the first P-channel device, it may not be on at very low voltage levels, such as zero. Yet the N-channel device is active at the lower voltage levels to pass the logic state associated with low or zero voltage. As the input signal rises, however, the P-channel device turns on and remains on until the input device is switched.

At next block 305, the gate of the first P-channel device is pulled low to turn it on to pass the input signal to the input device input until the input device changes state. An N-channel device having its source-to-drain path coupled between the gate of the first P-channel device and a low voltage level (e.g., ground) and its gate coupled to the output of the input device receiver performs this function well when the input device is a differential receiver. In the particular embodiment illustrated, the differential receiver receives the voltage-limited input signal at its inverting input and the reference threshold voltage at its non-inverting input. Thus, the output of the differential receiver switches in the opposite direction as the input signal.

At next block 307, the gate of the first P-channel device is pulled high to the level of the input signal to turn it off when the input signal reaches a threshold level above the source voltage and sufficient to switch the input device. In the particular embodiment illustrated, a second P-channel device clamps a well node to the source voltage while the input signal is low, a third P-channel device pulls the well node to the level of the input signal when it reaches and exceeds the source voltage level, and a fourth P-channel device pulls the gate of the first P-channel device to the voltage level of the well node and input signal when it reaches a threshold level above the source voltage.

At next block 309, the input of the input device is clamped to a peak level that is less than the maximum input voltage level. In the particular embodiment illustrated, a fifth P-channel device having its source and gate coupled to the source voltage and its drain coupled to the drains of the N-channel and P-channel devices performs this function well. The fifth P-channel device ensures that the voltage applied to the input of the input device does not exceed its maximum voltage rating.

An overvoltage protection apparatus with input signal threshold detection according to an embodiment of the present invention provides a receiver or input device that is configured to tolerate input voltages that are higher than its source voltage, where input signals would otherwise be clamped to a level that is too low to reliably excite input threshold detection circuitry. In one embodiment, for example, the present invention contemplates a 1.25V–1.5V receiver that is configured to tolerate input voltages up to 3.3 volts. At least one benefit is that input signal levels provided to a protected device are slightly boosted so that the logic level associated with the higher voltage level is reliably detected without violating the maximum voltage limit.

Although the present invention has been described in considerable detail with reference to certain preferred versions thereof, other versions and variations are possible and contemplated. Those skilled in the art should appreciate that they can readily use the disclosed conception and specific embodiments as a basis for designing or modifying other structures for providing out the same purposes of the present invention without departing from the spirit and scope of the invention as defined by the appended claims.

What is claimed is:

1. An overvoltage protection circuit for a receiver, the receiver having an input for detecting the state of a high voltage level input signal using a logic switching threshold based on a low voltage level source voltage and having a maximum voltage limit between the low and high voltage levels, said overvoltage protection circuit comprising:

a first pass device having a control terminal receiving the source voltage and a current path for passing the input signal to the input of the receiver up to a first voltage level below the source voltage;

a second pass device having a control terminal and having a current path coupled in parallel with said current path of said first pass device; and a protection control circuit, coupled to said control terminal of said second pass device, that controls said second pass device to allow the input signal to rise above said first voltage level up to a threshold voltage below the maximum voltage limit and above the source voltage sufficient to meet the logic switching threshold;

wherein said second pass device comprises a first P-channel device having a gate coupled to said protection control circuit, a source for receiving the input signal, and a drain for coupling to the receiver; and wherein the receiver has an output for providing an output signal indicative of the input signal, and wherein said protection control circuit comprises:

an N-channel circuit, coupled to said gate of said first P-channel device and receiving the output signal, holds said first P-channel device on while the input signal increases until the input circuit changes the state of the output signal; and a P-channel circuit, coupled to said source and gate of said first P-channel device and receiving the input signal and the source voltage, that turns off said first P-channel device when the input signal reaches said threshold voltage.

2. The overvoltage protection circuit of claim 1, wherein said first pass device comprises an N-channel device having a gate for receiving the source voltage, a drain for receiving the input signal, and a source for coupling to the input of the receiver.

3. The overvoltage protection circuit of claim 1, wherein said N-channel circuit comprises:

a first N-channel device having a source coupled to ground, a gate receiving the output signal, and a drain; and a second N-channel device having a source coupled to said drain of said first N-channel device, a gate receiving the source voltage, and a drain coupled to said gate of said first P-channel device.

4. The overvoltage protection circuit of claim 1, wherein said P-channel circuit comprises:

said first P-channel device having a bulk coupled to a well node;

a second P-channel device having a source receiving the source voltage, a gate receiving the input signal, and a drain and bulk coupled to said well node;

a third P-channel device having a gate receiving the source voltage, a source receiving the input signal, and a drain and bulk coupled to said well node; and a fourth P-channel device having a drain coupled to said gate of said first P-channel device, a gate receiving the source voltage, and a source and bulk coupled to said well node.

5. The overvoltage protection circuit of claim 4, wherein said second P-channel device is operative to clamp said well node to the source voltage while the input signal is below the source voltage, wherein said third P-channel device is operative to pull said well node to the level of the input signal when the input signal rises above the source voltage, and wherein said fourth P-channel device is operative to drive said gate of said first P-channel device to said well node voltage when said well node rises above the source voltage.

6. The overvoltage protection circuit of claim 4, wherein said P-channel circuit further comprises a fifth P-channel device having a gate and source receiving the source voltage and a drain coupled to said drain of said first P-channel device.

7. The overvoltage protection circuit of claim 6, wherein said fifth P-channel device is operative to limit said drains of said first P-channel and N-channel devices to a peak voltage that is less than the maximum voltage limit.

8. A switching circuit for indicating the state of an input signal which ranges up to a high voltage, comprising:

a sense circuit, having an input for sensing the state of the input signal relative to a reference voltage based on a source voltage which is less than the high voltage, and having an output for providing a first output signal indicative of the state of the input signal, said input being limited to a maximum voltage that is greater than the source voltage and less than the high voltage;

a first clamp circuit that passes the input signal to said input of said sense circuit up to a first voltage that is less than said source voltage;

a second clamp circuit that passes the input signal to said input of said sense circuit up to a threshold voltage that is between said source and maximum voltages, said second claim circuit comprising:

a first device having a gate, a source for receiving the input signal, and a drain coupled to said input of said sense circuit; and a voltage control circuit coupled to the gate of said first P-channel device, said voltage control circuit comprising:

an N-channel circuit, coupled to said gate of said first P-channel device and receiving said first output signal, that activates said first P-channel device to pass the input signal until said first output signal changes state; and a P-channel circuit, coupled to said source and gate of said first P-channel device and receiving the in output signal and said source voltage, that turns off said first P-channel device when the input signal reaches said threshold voltage;

said first output signal providing an inverted indication of the input signal; and an inverter having an input coupled to said output of said sense circuit and an output providing a second output signal which provides a non-inverting indication of the input signal.

9. The switching circuit of claim 8, wherein said threshold voltage is sufficient to excite said sense circuit under expected operating conditions including noise, thermal gradients, and power supply variation.

10. The switching circuit of claim 8, wherein said first clamp circuit comprises an N-channel device having a gate receiving said source voltage, a drain for receiving the input signal, and a source coupled to said input of said sense circuit.

11. The switching circuit of claim 8, wherein said N-channel circuit comprises:

a first N-channel device having a source coupled to ground, a gate receiving said first output signal, and a drain; and a second N-channel device having a source coupled to said drain of said first N-channel device, a gate receiving said source voltage, and a drain coupled to said gate of said first P-channel device.

12. The switching circuit of claim 8, wherein said P-channel circuit comprises:

said first P-channel device having a bulk coupled to a well node;

a second P-channel device having a source receiving said source voltage, a gate receiving the input signal, and a drain and bulk coupled to said well node;

a third P-channel device having a gate receiving said source voltage, a source receiving the input signal, and a drain and bulk coupled to said well node; and a fourth P-channel device having a drain coupled to said gate of said first P-channel device, a gate receiving said source voltage, and a source and bulk coupled to said well node.

13. The switching circuit of claim 12, wherein said second P-channel device is operative to clamp said well node to said source voltage while the input signal is below said source voltage, wherein said third P-channel device is operative to pull said well node to the level of the input signal when the input signal rises above said source voltage, and wherein said fourth P-channel device is operative to drive said gate of said first P-channel device to a voltage of said well node when said well node rises above said source voltage.

14. The switching circuit of claim 12, wherein said P-channel circuit further comprises a fifth P-channel device having a gate and source receiving said source voltage and a drain coupled to said drain of said first P-channel device.

15. The switching circuit of claim 14, wherein said fifth P-channel device is operative to limit said drains of said first P-channel and N-channel devices to a peak voltage that is less than said maximum voltage.

16. A method of ensuring logic threshold detection while providing overvoltage protection for an input device that detects the state of an input signal having a high logic level that exceeds the maximum input voltage level of the input device, comprising:
  coupling the drain-to-source path of a first N-channel device between an input signal and the input of the input device and providing a source voltage to the gate of the first N-channel device;
  coupling the source-to-drain path of a first P-channel device between an input signal and the input of the input device;
  pulling the gate of the first P-channel device low to turn on the first P-channel device to pass the input signal to the input device input until the input device changes state, wherein said pulling the gate of the first P-channel device low comprises coupling the source-to-drain path of at least one second N-channel device between the gate of the first P-channel device and a low voltage level and controlling the at least one second N-channel device with the output of the input device; and
  pulling the gate of the first P-channel device high to the level of the input signal to turn off the first P-channel device when the input signal reaches a threshold level above the source voltage and sufficient to switch the input device.

17. The method of claim 16, wherein said pulling the gate of the first P-channel device high comprises:
  coupling the source-to-drain path of a second P-channel device between a well node and the source voltage and providing the input signal to the gate of the second P-channel device;
  coupling the source-to-drain path of a third P-channel device between the input signal and the well node and providing the source voltage to the gate of the third P-channel device; and
  coupling the drain-to-source path of a fourth P-channel device between the gate of the first P-channel device and the well node and providing the source voltage to the gate of the fourth P-channel device.

18. The method of claim 16, further comprising clamping the input of the input device to a peak level that is less than the maximum input voltage level.

19. The method of claim 18, wherein said clamping the input of the input device to a peak level comprises providing the source voltage to the gate and source of a fifth P-channel device and coupling the drain of the fifth P-channel device to the drain of the first P-channel device.

* * * * *